(12) United States Patent
Mallik

(10) Patent No.: US 9,748,368 B2
(45) Date of Patent: Aug. 29, 2017

(54) TUNNEL FIELD-EFFECT TRANSISTOR (TFET) WITH SUPERSTEEP SUB-THRESHOLD SWING

(71) Applicant: University of Calcutta, Kolkata (IN)

(72) Inventor: Abhijit Mallik, Sonarpur (IN)

(73) Assignee: UNIVERSITY OF CALCUTTA, Kolkata (IN)

( * ) Notice: Subject to any disclaimer, the term of this patent is extended or adjusted under 35 U.S.C. 154(b) by 0 days.

(21) Appl. No.: 14/902,480

(22) PCT Filed: Aug. 23, 2013

(86) PCT No.: PCT/IB2013/056828
§ 371 (c)(1),
(2) Date: Dec. 31, 2015

(87) PCT Pub. No.: WO2015/001399
PCT Pub. Date: Jan. 8, 2015

(65) Prior Publication Data
US 2016/0141398 A1    May 19, 2016

(30) Foreign Application Priority Data
Jul. 3, 2013  (IN) .............................. 798/KOL/2013

(51) Int. Cl.
*H01L 29/66*    (2006.01)
*H01L 29/739*   (2006.01)
(Continued)

(52) U.S. Cl.
CPC .... *H01L 29/66977* (2013.01); *H01L 29/0657* (2013.01); *H01L 29/0843* (2013.01);
(Continued)

(58) Field of Classification Search
CPC .............................................. H01L 29/66977
See application file for complete search history.

(56) References Cited

U.S. PATENT DOCUMENTS 7,598,128 B2 * 10/2009 Hsu ..................... H01L 29/0657
   438/140
8,349,717 B2    1/2013 Cai
(Continued)

FOREIGN PATENT DOCUMENTS

CN    1930690 A      3/2007
WO    2005091371 A2  9/2005
WO    2012152762 A1  11/2012

OTHER PUBLICATIONS

Asra, R., et al., "A Tunnel FET for VDD Scaling Below 0.6 V With a CMOS-Comparable Performance," IEEE Transactions on Electron Devices, vol. 58, Issue 7, pp. 1855-1863 (May 12, 2011).

(Continued)

*Primary Examiner* — Eugene Lee
(74) *Attorney, Agent, or Firm* — Turk IP Law, LLC

(57) ABSTRACT

Technologies are generally described herein generally relate to tunnel field-effect transistor (TFETs) structures with a gate-on-germanium source (GoGeS) on bulk silicon substrate for sub 0.5V ($V_{DD}$) operations. In some examples, the GoGeS structure may include an increase in tunneling area and, thereby, a corresponding increases in the ON-state current $I_{ON}$. In order to achieve supersteep sub-threshold swing, both the lateral tunneling due to gate electric-field and the non-uniform tunneling at the gate-edge due to field-induced barrier lowering (FIBL) may be suppressed through selection of component dimension in the device structure. Example devices may be fabricated using CMOS fabrication technologies with the addition of selective etching in the process flow.

14 Claims, 9 Drawing Sheets

(51) Int. Cl.
H01L 29/06 (2006.01)
H01L 29/08 (2006.01)
H01L 29/10 (2006.01)
H01L 29/786 (2006.01)

(52) U.S. Cl.
CPC .... *H01L 29/1025* (2013.01); *H01L 29/66356* (2013.01); *H01L 29/66742* (2013.01); *H01L 29/7391* (2013.01); *H01L 29/78618* (2013.01); *H01L 29/78696* (2013.01)

(56) References Cited

U.S. PATENT DOCUMENTS

| | | | |
|---|---|---|---|
| 9,099,555 | B2 * | 8/2015 | Le Royer ............ H01L 29/7831 |
| 2011/0084319 | A1 | 4/2011 | Zhu et al. |
| 2011/0147838 | A1 | 6/2011 | Gossner et al. |
| 2011/0241103 | A1 | 10/2011 | Curatola et al. |
| 2011/0278542 | A1 * | 11/2011 | Bangsaruntip ......... B82Y 10/00 257/24 |
| 2011/0278670 | A1 | 11/2011 | Loh et al. |
| 2012/0032227 | A1 | 2/2012 | Seabaugh et al. |
| 2012/0228706 | A1 | 9/2012 | Sugizaki et al. |
| 2013/0134504 | A1 * | 5/2013 | Kondo ................ H01L 29/7391 257/330 |

OTHER PUBLICATIONS

Aydin, C., et al., "Lateral interband tunneling transistor in silicon-on-insulator," Applied Physics Letters, vol. 84, Issue 10, pp. 1780-1782 (2004).

Bhuwalka, K.K., et al., "Scaling the vertical tunnel FET with tunnel bandgap modulation and gate work function engineering," IEEE Transactions on Electron Devices, vol. 52, Issue 5, pp. 909-917 (May 2005).

Bhuwalka, K.K., et al., "Vertical tunnel field-effect transistor," IEEE Transactions on Electron Devices, vol. 51, Issue 2, pp. 279-282 (Feb. 2004).

Boucart, K., and Ionescu, A.M., "Double-gate tunnel FET with high-κ gate dielectric," IEEE Transactions on Electron Devices, vol. 54, No. 7, pp. 1725-1733 (Jul. 2007).

Chattopadhyay, A., and Mallik, A., "Impact of a Spacer Dielectric and a Gate Overlap/Underlap on the Device Performance of a Tunnel Field-Effect Transistor," IEEE Transaction on Electron Devices, vol. 58, Issue 3, pp. 677-683 (Mar. 2011).

Mallik, A. and Chattopadhyay, A., "Impact of a Spacer-Drain Overlap on the Characteristics of a Silicon Tunnel Field-Effect Transistor Based on Vertical Tunneling," IEEE Transactions on Electron Devices, vol. 60, Issue 3, pp. 935-943 (Jan. 24, 2013).

Mallik, A., and Chattopadhyay, A., "The impact of fringing field on the device performance of a P-channel tunnel field-effect transistor with a high-κ gate dielectric," IEEE Transaction on Electron Devices, vol. 59, Issue 2, pp. 277-282 (Nov. 16, 2011).

Choi, W.Y., et al., "Tunneling field-effect transistors (TFETs) with subthreshold swing (SS) less than 60mV/dec," IEEE Electron Device Letters, vol. 28, Issue 8, pp. 743-745 (Aug. 2007).

Hansch, W., "A vertical MOS-gated Esaki tunneling transistor in silicon," Thin Solid Films, vol. 369, Issue 1-2, pp. 387-389 (Jul. 2000).

Hansch, W., et al., "Performance improvement in vertical surface tunneling transistors by a boron surface phase," Japanese Journal of Applied Physics, vol. 40, Part 1, No. 5A, pp. 3131-3136 (May 2001).

International Search Report and Written Opinion for International Application No. PCT/IB2013/056828 mailed Mar. 21, 2014.

Koga, J., and Toriumi, A., "Three-terminal silicon surface junction tunneling device for room temperature operation," IEEE Electron Device Letters, vol. 20, Issue 10, pp. 529-531 (Oct. 1999).

Kim, S.H., et al., "Tunnel Field Effect Transistor With Raised Germanium Source," IEEE Electron Device Letters, vol. 31, Issue 10, pp. 1107-1109 (Aug. 30, 2010).

Kim, S.H., et al., "Germanium-source tunnel field effect transistors with record high ION/IOFF," International Symposium on VLSI Technology, pp. 178-179 (Jun. 16-18, 2009).

Lattanzio, L., et al., "Complementary Germanium Electron-Hole Bilayer Tunnel FET for Sub-0.5-V Operation," vol. 33, Issue 2, pp. 167-169 (Dec. 6, 2011).

Leonelli, D., et al., "Novel Architecture to Boost the Vertical Tunneling in Tunnel Field Effect Transistors," Proceedings on IEEE International SOI Conference, pp. 1-2 (Oct. 3-6, 2011).

Li, R., et al., "AlGaSb/InAs Tunnel Field-Effect Transistor With On-Current of 78 μA/μm at 0.5 V," IEEE Electron Device Letters, vol. 33, Issue 3, pp. 363-365 (Jan. 26, 2012).

Low, K.L., et al., "Device Physics and Design of a L-Shaped Germanium Source Tunneling Transistor," Japanese Journal of Applied Physics, vol. 51, Issue 2 (Feb. 20, 2012).

Lu, Y., et al., "Performance of AlGaSb/InAs TFETs With Gate Electric Field and Tunneling Direction Aligned," IEEE Electron Device Letters, vol. 33, Issue 5, pp. 65-657 (Feb. 21, 2012).

Rao, V.R., et al., "Tunnel FETs : Devices for Ultra Low Voltage Operation," IIT Bombay Department of electrical engineering, pp. 1-44 (Apr. 14, 2012).

Reddick, W.M., and Amaratunga, G.A.J., "Silicon surface tunnel transistor," Applied Physics Letters, vol. 67, Issue 4, pp. 494-497 (Jul. 2005).

Schlosser, M., et al., "Fringing-induced drain current improvement in the tunnel field-effect transistor with high-κ gate dielectrics," IEEE Transactions on Electron Devices, vol. 56, Issue 1, pp. 100-108 (Dec. 16, 2008).

Seabaugh, A.C., and Zhang, Q., "Low-Voltage Tunnel Transistors for Beyond CMOS Logic," IEEE Proceedings, vol. 98, Issue. 12, pp. 2095-2110 (Oct. 25, 2010).

Toh, E.H., et al., "Device Design and Scalability of a Double-Gate Tunneling Field-Effect Transistor with Silicon-Germanium Source," Japanese Journal of Applied Physics, vol. 47, No. 4S, pp. 2593-2597 (Apr. 25, 2008).

Toh, E.H., et al., "Device physics and design of double-gate tunneling field-effect transistor by silicon film thickness optimization," vol. 90, Issue 26, pp. 263507-263507-3 (Jun. 2007).

Verhulst, A.S., "Si-based tunnel field-effect transistors for low-power nanoelectronics," 2011 69th Annual Device Research Conference (DRC), pp. 193-196 (Jun. 20-22, 2011).

Wang, P.F., et al., "Complementary tunneling transistor for low power applications," Solid-State Electronics, vol. 48, Issue 12, pp. 2281-2286 (Dec. 2004).

* cited by examiner

COMPUTER PROGRAM PRODUCT 700

SIGNAL-BEARING MEDIUM 702

704 AT LEAST ONE OF
 ONE OR MORE INSTRUCTIONS FOR
 PROVIDING A SUBSTRATE OF A FIRST SUBSTRATE MATERIAL;
 DEFINING DRAIN REGION BY DOPING THE FIRST SUBSTRATE MATERIAL WITH DOPANTS OF A FIRST TYPE;
 REDUCING PART OF TOP SUBSTRATE TO CREATE A STEP IN THE CHANNEL REGION;
 FURTHER REDUCING PART OF THE SUBSTRATE TO ALLOW ROOM FOR SOURCE REGION;
 GROWING SOURCE REGION (Ge HEAVILY DOPED WITH DOPANTS OF SECOND TYPE);
 FORMING GATE DIELECTRIC AND GATE METAL;
 REDUCING PART OF TOP OF SOURCE REGION;
 FORMING SIDE-WALL SPACER(S); AND/OR
 FORMING SOURCE, GATE, DRAIN ELECTRODES THROUGH SILICIDATION/METALLIZATION.

| COMPUTER-READABLE MEDIUM 706 | RECORDABLE MEDIUM 708 | COMMUNICATIONS MEDIUM 710 |

FIG. 7

TUNNEL FIELD-EFFECT TRANSISTOR (TFET) WITH SUPERSTEEP SUB-THRESHOLD SWING

CROSS-REFERENCE TO RELATED APPLICATIONS

This Application is the U.S. National Stage filing under 35 U.S.C. §371 of International Application No. PCT/IB2013/056828, filed on Aug. 23, 2013, which claims priority under 35 U.S.C. §119(a) and 35 U.S.C. 119(b) of India Patent Application No. 798/KOL/2013, filed on Jul. 7, 2013. The disclosures of the International Application No. PCT/IB2013/056828 and the India Application No. 798/KOL/2013 are herein incorporated by reference in their entireties.

BACKGROUND

Unless otherwise indicated herein, the materials described in this section are not prior art to the claims in this application and are not admitted to be prior art by inclusion in this section.

Device dimensions in CMOS technology, the dominant technology used for digital logic and semiconductor memories, have been scaled in the past few decades to achieve improved performance particularly in terms of speed of operation, dynamic power dissipation, and packing density of the logic and memory devices. In CMOS design, various design parameters can be adjusted to realize a practical implementation. Example design parameters may include the OFF-State leakage current, low, which indicates the leakage power dissipation; and the ON-state current. $I_{ON}$, which impacts the speed of operation. In some designs it may be desired to maintain $I_{OFF}$ as low as possible while also maintaining $I_{ON}$ as high as possible, resulting in the ratio of $I_{ON}/I_{OFF}$ being maintained as high as possible. In order to achieve high values of $I_{ON}$ and low values of $I_{OFF}$ (or high $I_{ON}$ and a high $I_{ON}/I_{OFF}$ ratio), the sub-threshold swing of the device, which may be defined as the gate voltage shift needed to change the drain current by one order of magnitude (one decade), may be low.

In practical CMOS designs, short-channel effects such as Drain Induced Barrier Lowering (DIBL) may cause a substantial increase in $I_{OFF}$ due to dimension scaling (decrease of dimensions proportionally). The supply voltage $V_{DD}$ may also need to be decreased in order to reduce power density and short-channel effects. Decreased values of $V_{DD}$ may need a reduction in the threshold, voltage, $V_T$, in order to achieve commensurate device performance. Sub-threshold swing, SS, may have a fundamental physical limit of 60 mV/decade ((kT/q)*ln(10)) for a conventional MOSFET at room temperature. Due to this limitation, efforts to reduce values of $V_{DD}$ may further increase the leakage current and, therefore, $V_{DD}$ may not be able to be practically scaled much further below 1.0 V or so for conventional CMOS technology.

In the search for an alternative CMOS-compatible device with a low sub-threshold swing SS to maintain high $I_{ON}$ with an acceptable $I_{OFF}$ for further extending Moore's law for digital and memory applications, tunnel field-effect transistors (TFETs) have shown promise. Conventional injection mechanisms of TFETs tray be based on a band-to-band tunneling (BTBT) mechanism in contrast to the thermal injection mechanism of a conventional MOSFET that poses the fundamental SS limitation of 60 mV/decade on such devices.

In spite of their desired low SS, conventional TFETs typically have a low ON-state current, $I_{ON}$. Various improvements in $I_{ON}$ performance of TFETs have been reported through the use of lower band-gap material such as SiGe or Ge in the tunneling region. Various improvements include the use of double-gale architectures, high-k gate dielectrics, thin silicon bodies, and similar approaches. However, these types of improvements do not meet the industry needs of high $I_{ON}$ for sub-0.5V operation.

SUMMARY

The present disclosure generally describes techniques to achieve device structures for a gate-on-germanium source (GoGeS) tunnel field-effect transistor (TFET) on bulk silicon substrate.

According to some examples, tunnel field-effect, transistor (TFET) devices may be described. An example TFET device may include one or more of a substrate; a p-i-n tunnel structure formed within the substrate, where the p-i-n tunnel structure includes a source region of a first type, a dram region of a second type, and a channel region of the substrate between the dram region and me source region, and a gate electrode separated from the p-i-n tunnel structure through a gate dielectric, where the gate dielectric is positioned partially over the source region and partially over the channel region.

According to other examples, methods for fabricating a tunnel field-effect transistor (TFET) device may be described. An example method may include providing a substrate of a first substrate material; doping a first region of the first substrate material with dopants of a first type effective to form a drain region; reducing a first top portion of the substrate effective to form a stepped channel region; and reducing a portion of the first top portion of the substrate effective to form a source region. The example method may further include growing a source region of a first material doped with dopants of a second type over the reduced portion of the substrate; forming agate dielectric and a gate electrode over a portion of top surfaces of the source region and the channel region; reducing a portion of the top surface of the source region to allow room for a source electrode and a side-wall spacer material; and/or forming the side-wall spacer material over the reduced portion of the top surface of the source region and partially over the drain region and the channel region, where the side-wall spacer material substantially surrounds the gate dielectric and the gate electrode.

According to further examples, systems for fabricating a tunnel field-effect transistor (TFET) device may be described. An example system may include a deposition module, an etching module, and a controller. The deposition module may be configured to receive a substrate of a first substrate material; dope the first substrate material in a first region with dopants of a first type effective to form a drain region; grow a source region of a first material doped with dopants of a second type over a reduced portion of the substrate; and form the gate dielectric over a portion of a top surface of the source region and a portion of a channel region. The deposition module may also form a gate electrode over the gate dielectric; and form a side-wall, spacer material over a reduced portion of the top surface of the source region and partially over the drain region and the channel region, where the side-wall spacer material substantially surrounds the gate dielectric and the gate electrode. The etching module may be configured to reduce a first top portion of the substrate effective to form the channel region in a stepped shape; reduce a portion of the first top port ion of the substrate effective to form the source region, and reduce the portion of the top surface of the source region effective to form a source electrode and the side-wall spacer material. The controller may be configured to coordinate operations of the deposition module and the etching module.

According to yet other examples, a tunnel field-effect transistor (FET) device may be described. The tunnel FET device may include a substrate and a source, where a source bottom surface is interfaced with a top surface of the substrate, and where a first portion of the source has a lower thickness than a second portion of the source. The tunnel FET device may further include a drain, where a bottom surface of the drain is interfaced with the top surface of the substrate, where the source and the drain are separated by a channel of the substrate, and where a first surface of the channel is interfaced with a first surface of the second portion of the source; and a gate dielectric, where a bottom surface of the gate dielectric is interfaced with a top surface of the second portion of the source region and part of the top surface of the channel region.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

FIG. 7 illustrates a block diagram of an example, computer program product, all arranged in accordance with at least some embodiments described herein.

DETAILED DESCRIPTION

Figure 1A:
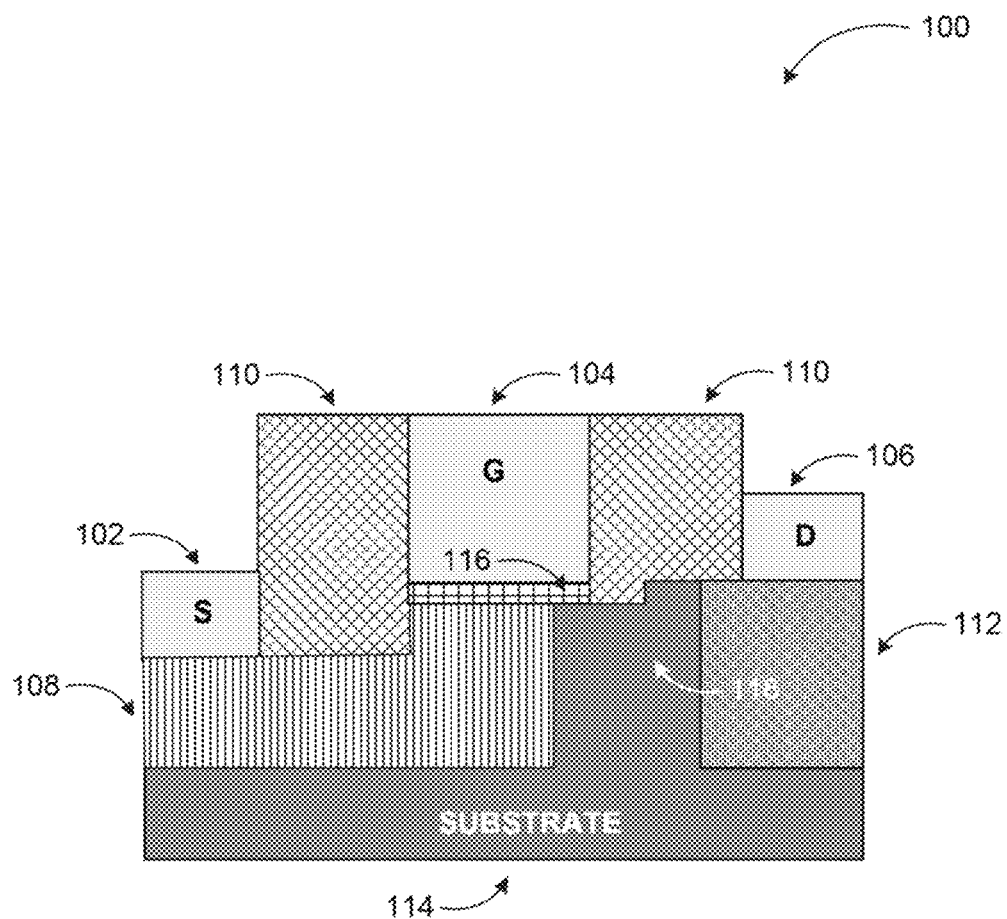
FIGS. 1A and 1B illustrate example TFET structures, where a gate-on-germanium source (GoGeS) structure with silicon or SOI substrate is configured for supersteep sub-threshold swing and high ON-state current, and example dimensions of the TFET structure.

In the following detailed description, reference is made to the accompanying drawings, which form a part hereof. In the drawings, similar symbols typically identify similar components, unless contest dictates otherwise. The illustrative embodiments described in the detailed description, drawings, and claims are not meant to be limiting. Other embodiments may be utilized, and other changes may be made, without departing from the spirit or scope of the subject matter presented herein, it will be readily understood that the aspects of the present disclosure, as generally described herein, and illustrated in the Figures, can be arranged, substituted, combined, separated, and designed in a wide variety of different configurations, all of which are explicitly contemplated herein.

This disclosure is generally drawing to tunnel field-effect transistor (TFET) devices with supersteep sub-threshold swing and methods, devices, systems, and/or computer program products for fabricating such TFET devices.

Briefly stated, technologies described herein generally relate to tunnel field-effect transistor (TFET) structures with a gate-on-germanium source (GoGeS) on balk silicon or silicon on insulator (SOI) substrate for sub0.5V (power supply $V_{DD}$) operations. In some examples, the GoGeS structure may result in an increased tunneling area and, thereby, a corresponding increase in the ON-state current $I_{ON}$. In order to achieve supersteep sub-threshold swing, lateral tunneling due to gate electric-field and non-uniform tunneling at the gate-edge due to field-induced barrier lowering (FIBL) may both be suppressed through selection of component dimensions in the device structure. Example devices may be fabricated using CMOS fabrication technologies with the addition of selective etching in the process flow.

Figure 1B:
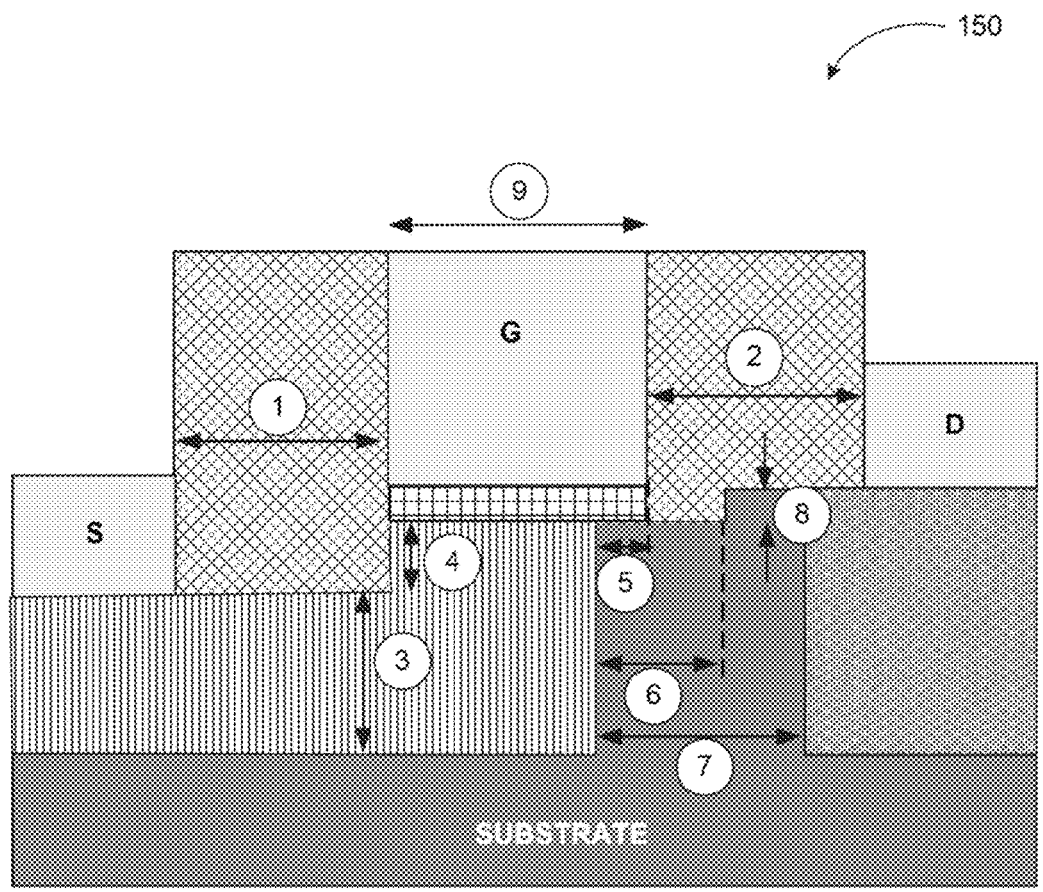

FIGS. 1A and 1B illustrate example TFET structures, where a gate-on-germanium source (GoGeS) structure with silicon or SOI substrate is configured for supersteep sub-threshold swing and high ON-state current, and example dimension of the TFET structure, arranged in accordance with at least some embodiments described herein.

A tunnel field-effect transistor (FET) device according to some embodiments, as shown in diagram 100, may include one or more of a source electrode 102, a gale electrode 104, a drain electrode 106, a source region 108, a spacer material 110, a drain region 112, a substrate 114, and a gate dielectric 116. The spacer material 110 is configured to substantially surround the gate electrode 104. Drain region 112 may be created through doping a region in the substrate 114. Source region 108 may be created by selective growth of doped germanium with doping materials of opposite type to the doping materials used in the drain region 112 (e.g., n for source, p for drain or vice versa).

In a TFET according to some embodiments, the source region may be formed using germanium (Ge), silicon-germanium (SiGe), indium-arsenide (InAs), or indium-gallium-arsenide (InGaAs) doped with dopants of a first type. The drain region may be formed using silicon or silicon-germanium heavily-doped with dopants of a second type. The substrate may be composed of silicon or silicon-germanium lightly-doped with dopants of either the first or the second type. Dopants may be introduced into semiconductors in a variety of techniques including, but not limited to, solid sources, gases, spin on liquid, surface diffusion, and/or ion implanting. Dopants for silicon and germanium (group IV semiconductors) may include group V atoms such as antimony, phosphorus, and arsenic as donors and group III atoms such as boron, aluminum, and gallium as acceptors. Dopants for gallium arsenide (a group III-V semiconductor) may include group VI and group IV atoms such as sulfur, selenium, tellurium, silicon, and germanium as donors and group II and group IV atoms such as magnesium, zinc, cadmium, silicon, and germanium as acceptors.

An example GoGeS TFET structure arranged according to embodiments described herein may be configured to increase a tunneling area and, thereby, increase the ON-state current, $I_{ON}$. In order to achieve a supersteep (i.e., sharply increasing) sub-threshold swing, lateral tunneling due to gate electric-field and non-uniform tunneling at the gate-edge due to field-induced barrier lowering (FIBL) may both be suppressed. The suppression may be achieved through selection of component dimensions in the device structure, which may be fabricated using CMOS fabrication technologies with the addition of selective etching in the process flow.

As shown in the cross-sectional view of the GoGeS TFET structure in diagram 100, the highly doped p-type Ge source region (108), a portion of the substrate (114), and the highly doped n-type Si drain region (112) may be configured, respectively, as the source region 108, the channel region 118, and the drain region 112. The channel section 118, as used herein refers to a portion of the substrate 114 between the source and drain regions that is configured to act as the channel. While one or both of the source and drain regions may be highly doped regions, some example TFET devices may be implemented on bulk p-type silicon wafer with moderate doping concentration. For example, the doping concentrations for the source, the drain, and the bulk silicon substrate may be $1 \times 10^{19}$, $1 \times 10^{20}$, and $1 \times 10^{17}$ atoms/cm$^3$, respectively.

The gate dielectric 116 may be a high-k dielectric such as a hafnium based oxide of a given equivalent oxide thickness (EOT). The spacer material may include a silicon based oxide (e.g., $SiO_2$) or silicon nitride. For example, the gate dielectric 116 may be comprised of hafnium dioxide, $HfO_2$, with an equivalent oxide thickness of about 0.6 nm. The source, gate, and drain electrodes may be composed of any suitable metal such as aluminum.

In diagram 150 of FIG. 1B, various dimensions of a GoGeS TFET structure according to example embodiments are shown. Some or all of these dimensions may be selected to affect and/or adjust various characteristics of the TFET device such as the values of the ON-state current, $I_{ON}$, the OFF-state current, $I_{OFF}$, and/or the sub-threshold swing, SS. The dimensions may be selected based on desired operational parameters, materials used, overall size of the device, and intended applications.

For illustrative purposes, an example TFET device may have following dimensions. A width 9 of the gate electrode 104 may be about 30 nm and widths 1 and 2 of the side-wall spacer materials may be about 10 nm each, for example. A dimension 3 comprising a height of the portion of the source region 108 underneath the source electrode may be about 20 nm. A height 4 of a portion of the source region 108 underneath the gate electrode may be about 10 nm. Similarly, the height 8 of the portion of the channel region adjacent to the drain region (substantially the same height as the drain region 112) may be about 5 nm. A total width 7 of the channel region may be about 10 nm, while a width 6 of the portion of channel region that has substantially the same height as the source region 108 may be about 6 nm. A width 5 of the portion of the channel region underneath the gate electrode 104 may be about 3 nm.

The example dimensions, locations, sizes, and shapes of various parts of the TFET device, according to various embodiments discussed above, are for illustration purposes only and do not constitute a limitation on embodiments contemplated by the present disclosure. A GoGeS TFET with supersteep SS and high $I_{ON}$ may be implemented with other dimensions, locations sizes and shapes using the principles discussed herein.

Figure 2A:
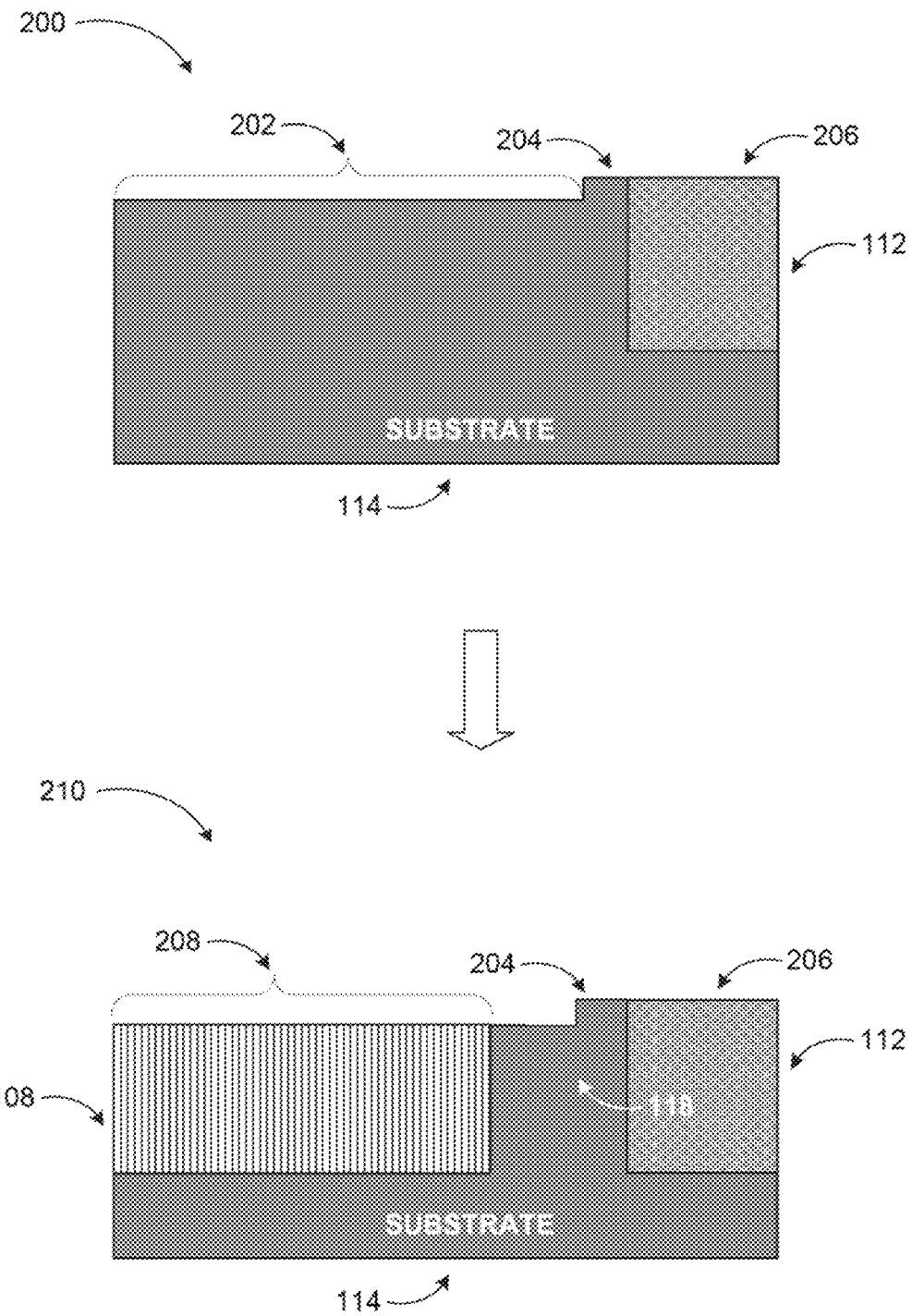
FIGS. 2A and 2B illustrate example fabrication stages of the GoGeS TFET structure described in FIG. 1A.
Figure 2B:
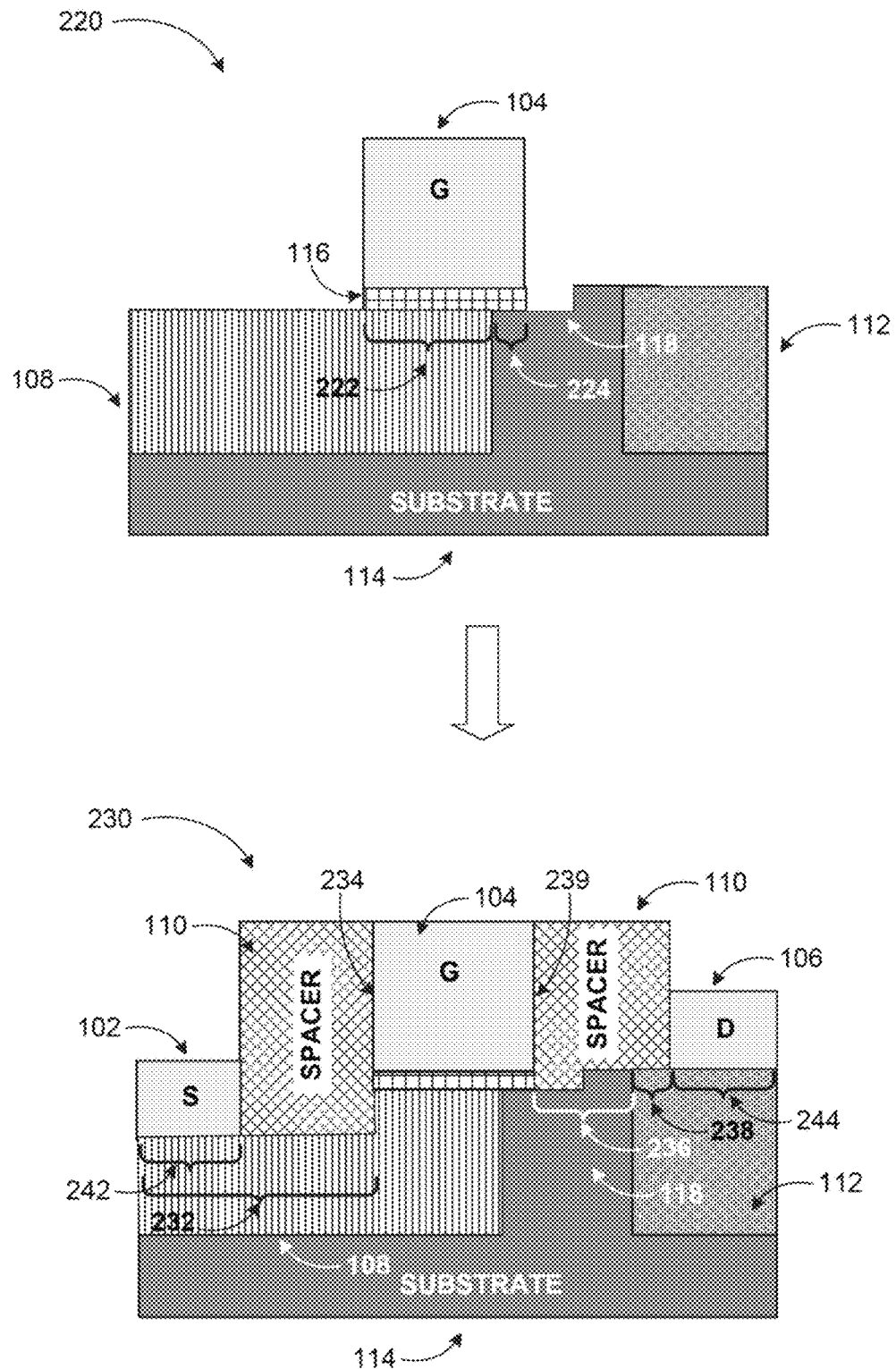

FIGS. 2A and 2B illustrate example fabrication stages of the GoGeS TFET structure described in FIG. 1A, arranged in accordance with at least some embodiments described herein.

The example fabrication stages in FIGS. 2A and 2B include stages 200, 210, 220, and 230. As shown in fabrication stage 200 of FIG. 2A, a portion of the substrate 114 may be doped with dopants of a first type (e.g., n-type or p-type) effective to form a drain region 112, and a first top portion 202 of the substrate reduced (for example, by etching) such that a second top portion 204 of the substrate 114 remains at substantially the same height as the top portion 206 of the drain region 112. Fabrication stage 200 may be followed by fabrication stage 210.

As shown in the fabrication stage 210 of FIG. 2A, a portion 208 of the first top portion 202 of the substrate 114 may be reduced and a source region 108 may be grown using germanium doped with dopants of a second type (e.g., p-type or n-type) over a region of the substrate 114 that has been reduced. As mentioned above, the channel region 118 refers to a portion of the substrate between the source region 108 and the drain region 112 that may act as the channel. Fabrication stage 210 may be followed by fabrication stage 220.

As shown in the fabrication stage 220 of FIG. 2B, a gate dielectric 116 may be formed over a portion 222 of the source region 108 and partially (224) over the channel region 118 that are substantially the same height. In some example embodiments, the gate dielectric may be composed of a hafnium based oxide. Next, a gate electrode 104 may be formed over at least a portion of the gate dielectric 116. Fabrication stage 220 may be followed by fabrication stage 230.

At fabrication stage 230 of FIG. 2B, a top portion 232 of the source region 108 that is not covered fey the gate dielectric 116 and the gate electrode 104 may be reduced. Next, a first side-wall spacer material 110 that interfaces the top portion 232 of the source region 108 and a side 234 of the gate electrode 104, and a second side-wall spacer material 110 that interfaces a portion 236 of the channel region 118, a top portion 238 of the drain region, and the other side 239 of gate electrode 104 may be formed. The first side-wall spacer material and the second side-wall spacer material may be composed of a silicon based oxide. Through silicidation and metallization, or similar techniques, a source electrode 102 and a drain electrode 106 may be formed on a portion 242 of the source region 108 and a portion 244 of the drain region 112, respectively.

In some examples, the drain region may be composed of silicon doped with dopants of a first type, the source region may be composed of germanium doped with dopants of a second type, and the substrate may be composed of silicon doped with dopants of either the first type or the second type (in lower concentrations compared to the drain region). In some examples, the dopants of the first type may be n-type dopants and the dopants of the second type may be p-type dopants. Alternatively, the dopants of the first type may be p-type dopants and the dopants of the second type may be n-type dopants.

The forming or reducing operations shown in stages 200, 210, 220, and 230 may be implemented using one or more of the semiconductor fabrication techniques selected from the group of chemical vapor deposition (CVD), low pressure CVD (LPCVD), atmospheric pressure CVD (APCVD), ultrahigh vacuum CVD (UHVCVD), atomic layering deposition (ALD), molecular layer deposition (MLD), plasma enhanced CVD (PECVD), metal-organic CVD (MOCVD), molecular beam epitaxy (MBE), splitter deposition, ion implantation, annealing, wet chemical etching, gaseous chemical etching, plasma etching, reactive ion etching (RIE), masking lithography, and chemical mechanical polishing (CMP).

Figure 3:
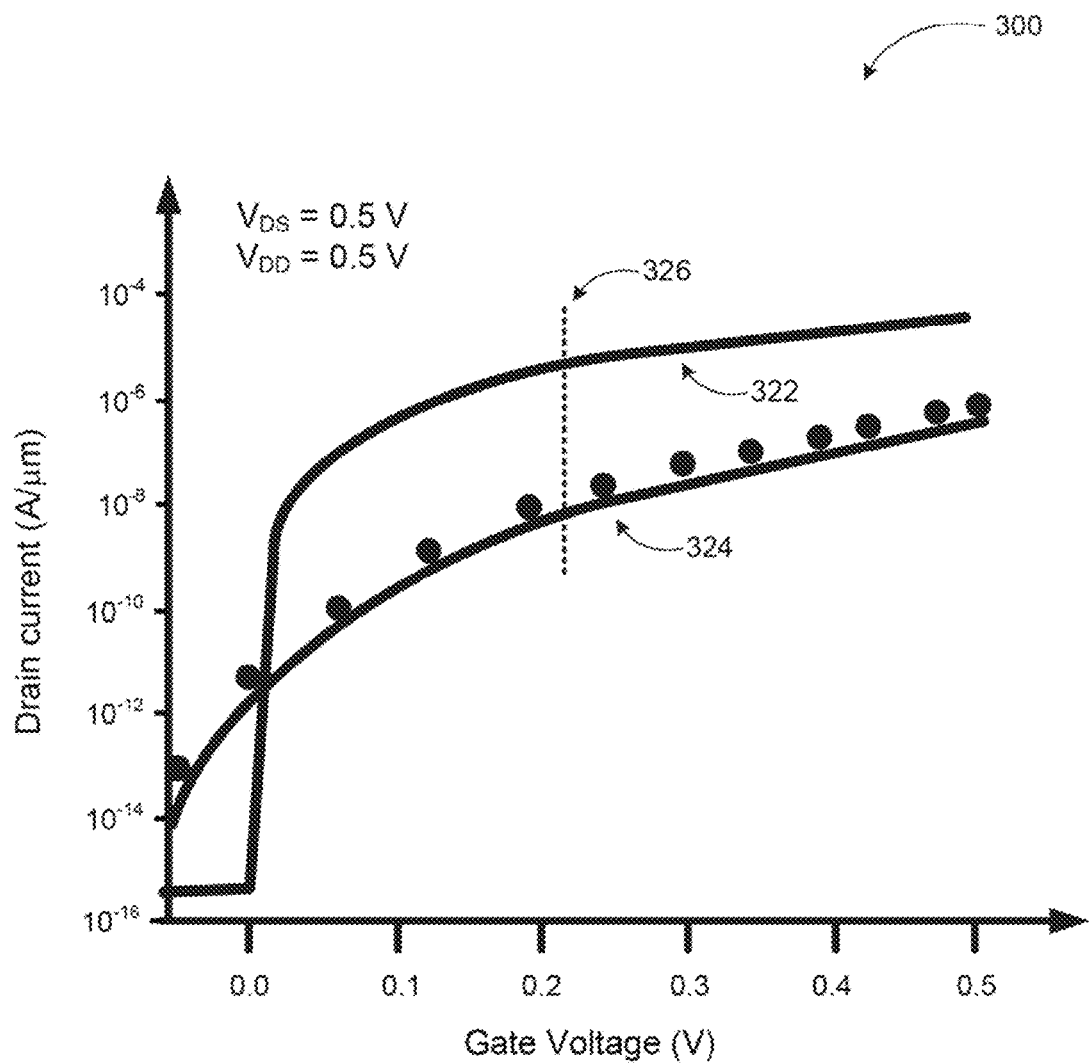
FIG. 3 illustrates example transfer characteristics of a GoGeS TFET structure compared against a model calibration characteristic.

FIG. 3 illustrates example transfer characteristics of a GoGeS TFET structure compared against model calibration characteristic, arranged in accordance with at least some embodiments described herein.

Diagram 300 shows simulated transfer characteristics of a GoGeS TFET structure (322) discussed in FIG. 1B with the example dimensions compared against model calibration and experimental data (324). The device characteristics in diagram 300 are shown across drain current (A/μm) and gate voltage (V) axes for drain-to-source voltage $V_{DS}$=0.5 V and $V_{DD}$=0.5 V. A supersteep sob-threshold swing and a high ON-state current may be observed for the GoGeS TFET according to embodiments in comparison with the calibration model. For example, a value of 45 μA/μm and $4.5 \times 10^8$ may be obtained for values of $I_{ON}$ and $I_{ON}/I_{OFF}$, respectively, for the GoGeS TFET device, as against 0.42 μA/μm and $3 \times 10^6$, respectively, for the example calibration device corresponding to power supply voltage $V_{DD}$ of 0.5 V (dotted line 326).

Figure 4:
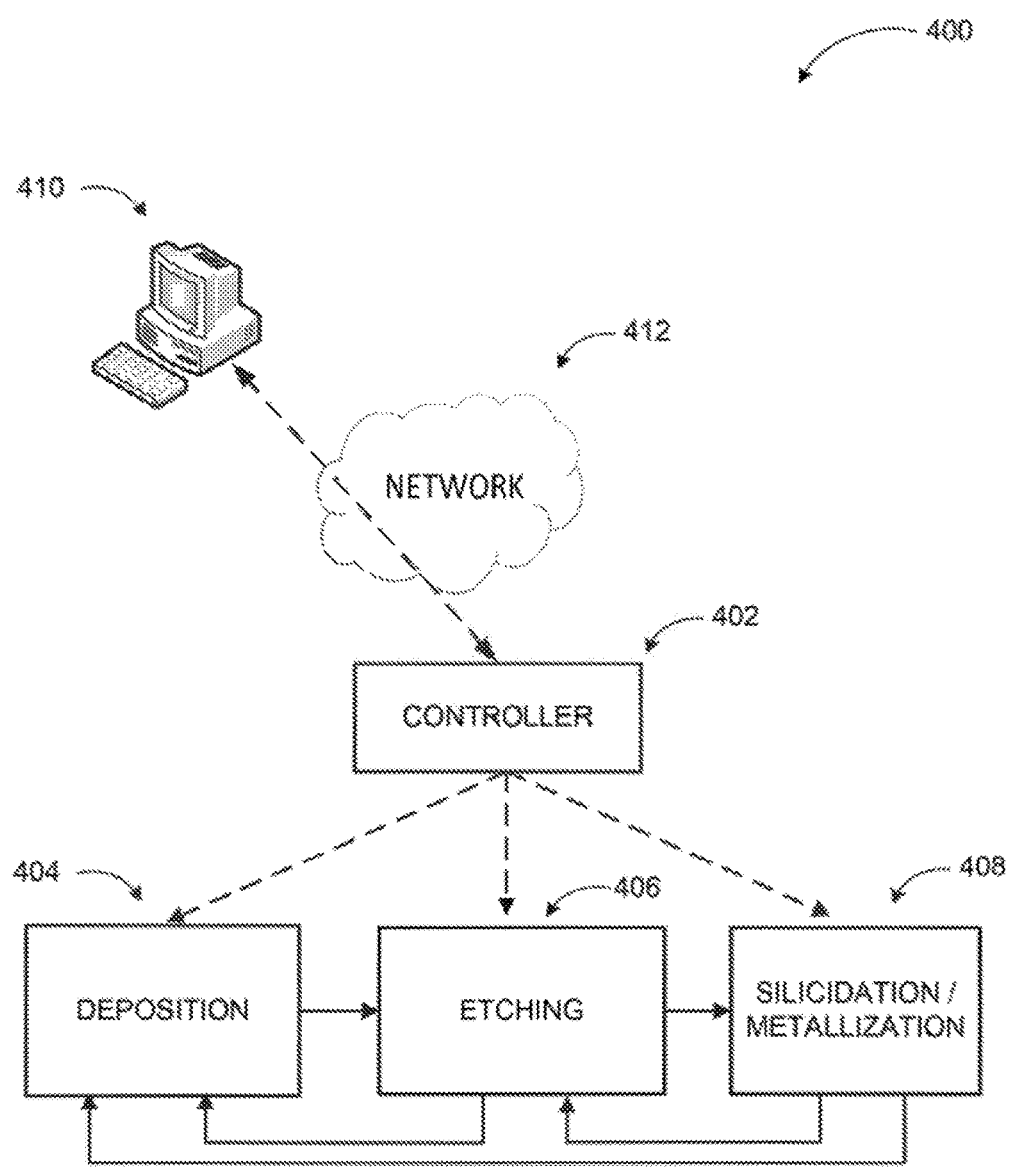
FIG. 4 illustrates an example system for fabricating a GoGeS TFET.

FIG. 4 illustrates an example system for fabricating a GoGeS TFET structure, arranged in accordance with at least some embodiments described herein.

As shown in diagram 400, a fabrication system for fabricating a GoGeS TFET Structure may include one or more of a deposition module 404, an etching module 406, and/or a silicidation/metallization module 408, along with a controller 402. Controller 402 may be configured to coordinate operations of one or more of the deposition module 404, the etching module 406, and/or the silicidation/metallization module 408 based on pre-programmed instructions or based on instructions received from a remote controller such as computing device 410 over one or more networks 412.

The deposition module 404 may be configured to: receive a substrate comprising a first substrate material; dope the first substrate material in a first region with dopants of a first type effective to form a drain region; grow a second region with dopants of a second type effective to form a source region (which may be reduced within the substrate by the etching module 406); form a gate dielectric over a top portion 222 of the source region and partially (224) over a channel region of the substrate between the source region and the drain region; and/or form a gate electrode over a portion of the gate dielectric. The deposition module 404 may further be configured to form a side-wall spacer material to substantially surround the gate electrode and to interface the source region, the channel region, and the drain region. The gate dielectric may be composed of a hafnium based oxide. The side-wall spacer material may be composed of a silicon based oxide. In some examples, part of the side-wall spacer may have a stepped thickness to allow the channel region of the substrate and the drain region to interface with substantially similar interface surfaces.

The etching module 406 may be configured to reduce a first top portion 202 of the substrate to create a step in the channel region 118, and further reduce a top portion 208 of the substrate to allow room for a source region. The etching module 406 may also reduce a top portion 232 of the source region to allow room for the side-wall spacer material and source electrode. The reductions may be performed through selective etching, for example, anisotropic dry etching. The silicidation/metallization module 408 may be configured to silicidize and metallize top surfaces of the source region and the drain region to form a source electrode and a drain electrode, respectively.

The operations of the modules described above may be performed in various orders depending on a selected fabrication technique. Furthermore, concentrations of the dopants, dimensions of the different regions may also be selected based on desired TFET attributes and materials used.

Figure 5:
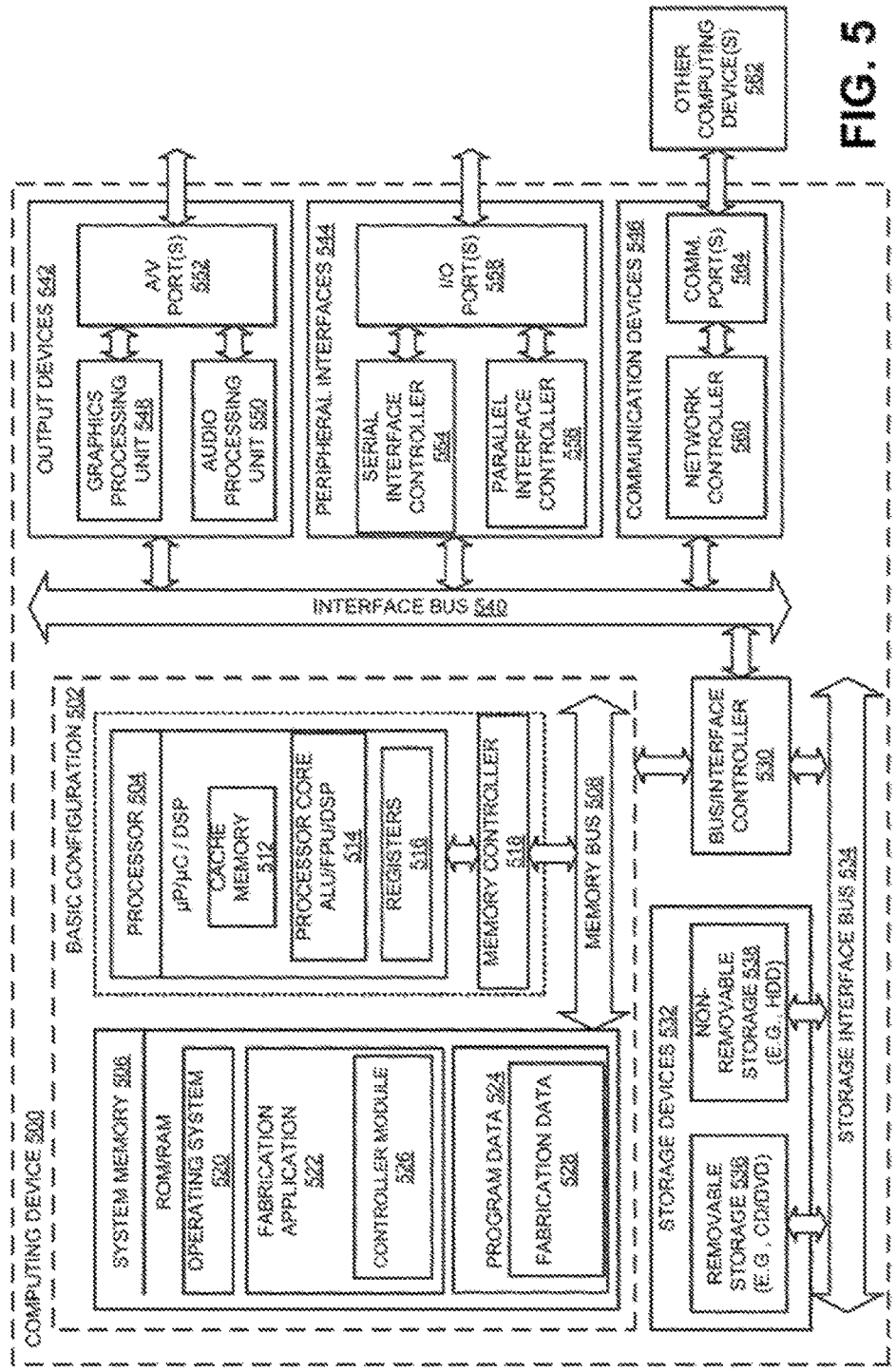
FIG. 5 illustrates a general purpose computing device, which may be used for controlling the example fabrication system of FIG. 4.

FIG. 5 illustrates a general purpose computing device, which may be used for controlling the example fabrication system of FIG. 4, all arranged in accordance with at least some embodiments described herein.

For example, the computing device 500 may be used to control operations of a fabrication system for fabricating a TFET device according to some example embodiments as described herein. In an example basic configuration 502, the computing device 500 may include one or more processors 504 and a system memory 506. A memory bus 508 may be used for communicating between the processor 504 and the system memory 506. The basic configuration 502 is illustrated in FIG. 5 by those components within the inner dashed line.

Depending on the desired configuration, the processor 504 may be of any type, including but not limited to a microprocessor (μP), a microcontroller (μC), a digital signal processor (DSP), or any combination thereof. The processor 504 may include one or more levels of caching, such as a cache memory 512, a processor core 514, and registers 516. The example processor core 514 may include an arithmetic logic unit (ALU), a floating point unit (FPU), a digital signal processing core (DSP Core), or any combination thereof. An example memory controller 518 may also be used with the processor 504, or in some implementations, the memory controller 518 may be an internal part of the processor 504.

Depending on the desired configuration, the system memory 506 may be of any type including but not limited to volatile memory (such as RAM), non-volatile memory (such as ROM, flash memory, etc.) or any combination thereof. The system memory 506 may include an operating system 520, a fabrication application 522, and program data 524. The fabrication application 522 may control operations of various fabrication systems through controller module 526 in forming various layers, doping different regions, and reducing portions of the TFET structure discussed herein. The program data 524 may include, among other data, fabrication data 528 or the like, associated with the various fabrication operations as described herein. For example, the fabrication data 528 may include dimensions, doping concentrations, and/or similar data.

The computing device 500 may have additional features or functionality, and additional interfaces to facilitate communications between the basic configuration 502 and any desired devices and interfaces. For example, a bus/interface controller 530 may be used to facilitate communications between the basic configuration 502 and one or more data storage devices 532 via a storage interface bus 534. The data storage devices 532 may be one or more removable storage devices 536, one or more non-removable storage devices 538, or a combination thereof. Examples of the removable storage and the non-removable storage devices include magnetic disk devices such as flexible disk drives and hard-disk drives (HDDs), optical disk drives such as compact disk (CD) drives or digital versatile disk (DVD) drives, solid state drives (SSDs), and tape drives to name a few. Example computer storage media may include volatile and non-volatile, removable and non-removable media implemented in any method or technology for storage of information, such as computer readable instructions, data structures, program modules, or other data.

The system memory 506, the removable storage devices 536 and the non-removable storage devices 538 are examples of computer storage media. Computer storage media includes, but is not limited to, RAM, ROM, EEPROM, flash memory or other memory technology, CD-ROM, digital versatile disks (DVDs), solid state drives (SSDs), or other optical storage, magnetic cassettes, magnetic tape, magnetic disk storage or other magnetic storage devices, or any other medium which may be used to store the desired information and which may be accessed by the computing device 500. Any such computer storage media may be part of the computing device 500.

The computing device 500 may also include an interface bus 540 for facilitating communication from various interface devices (e.g., one or more output devices 542, one or more peripheral interfaces 544, and one or more communication devices 546) to the basic configuration 502 via the bus/interface controller 530. Some of the example output devices 542 include a graphics processing unit 548 and an audio processing unit 550, which may be configured to communicate to various external devices such as a display or speakers via one or more A/V ports 552. One or more example peripheral interfaces 544 may include a serial interface controller 554 or a parallel interlace controller 556, which may be configured to communicate with external devices such as input devices (e.g., keyboard, mouse, pen, voice input device, touch input device, etc.) or other peripheral devices (e.g., printer, scanner, etc.) via one or more I/O ports 558. An example communication device 546 includes a network controller 560, which may be arranged to facilitate communications with one or more other computing devices 562 over a network communication link via one or more communication ports 564. The one or more other computing devices 562 may include servers, control modules on fabrication equipment, and comparable devices.

The network communication link may be one example of a communication media. Communication media may be embodied by computer readable instructions, data structures, program modules, or other data in a modulated data signal, such as a carrier wave or other transport mechanism, and may include any information delivery media. A "modulated data signal" may be a signal that bus one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

The computing device 500 may be implemented as apart of a general purpose or specialized server, mainframe, or similar computer that includes any of the above functions. The computing device 500 may also be implemented as a personal computer including both laptop computer and non-laptop computer configurations.

Example embodiments may also include methods for fabricating a GoGeS TFET device with supersteep subthreshold swing. These methods can be implemented in any number of ways, including the structures described herein. One such way may be by machine operations, of devices of the type described in the present disclosure. Another optional way may be for one or more of the individual operations of the methods to be performed in conjunction with one or more human operators performing some of the operations while other operations may be performed by machines. These human operators need not be collocated with each other, but each can be with a machine that performs a portion of the program, in other examples, the human interaction can be automated such as by pre-selected criteria that may be machine automated.

Figure 6:
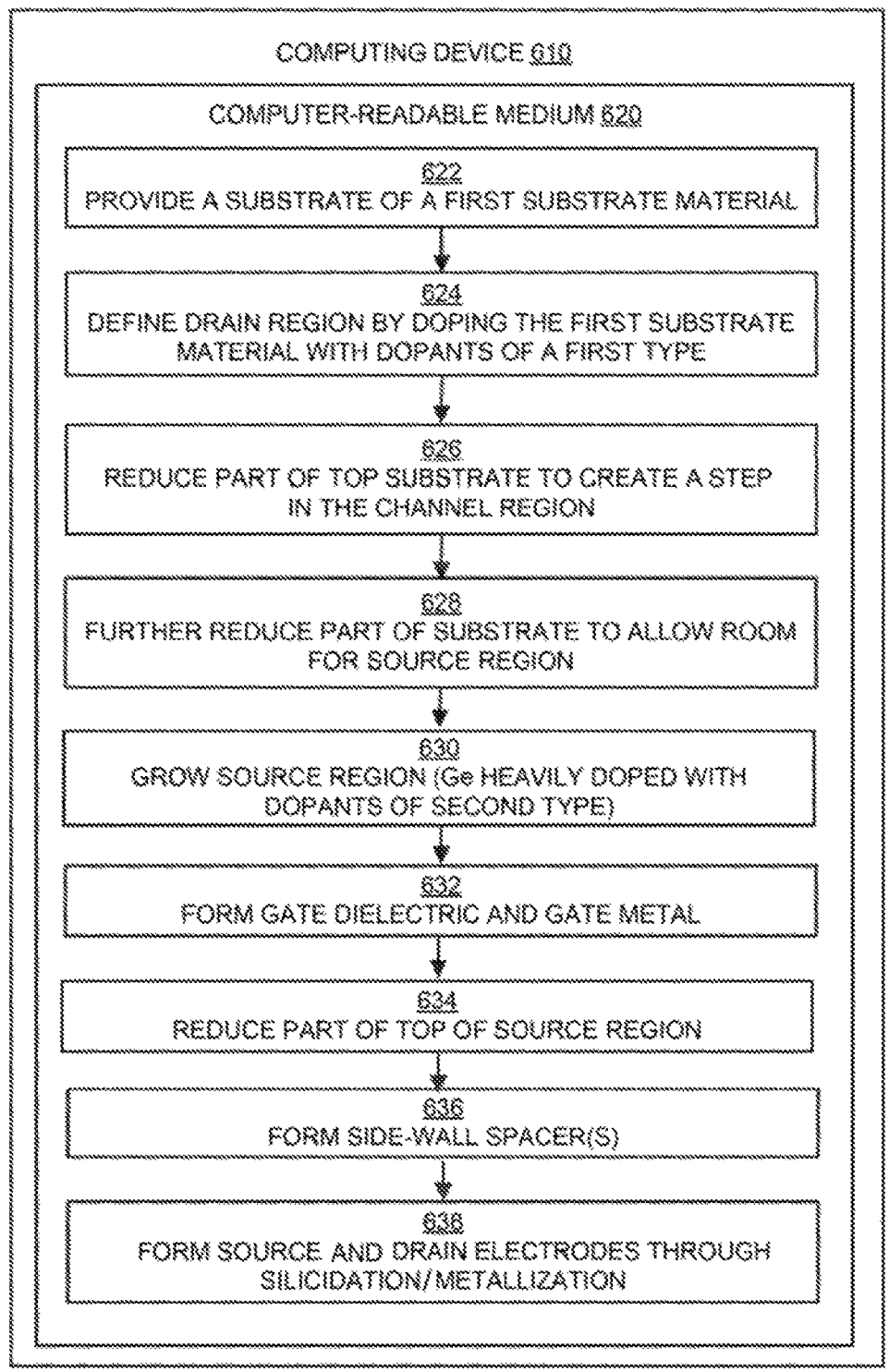
FIG. 6 is a flow diagram illustrating an example method for fabricating a GoGeS TFET structure that may be performed by a computing device such as the computing device in FIG. 5.

FIG. 6 is a flow diagram illustrating an example method for fabricating a GoGeS TFET structure that may be performed by a computing device such as the computing device in FIG. 5, arranged in accordance with at least some embodiments described herein.

Example methods may include one or more operations, functions or actions as illustrated by one or more of blocks 622, 624, 626, 628, 630, 632, and/or 634, and may in some embodiments be performed by a computing device such as the computing device 500 in FIG. 5. The operations described in the blocks 622-634 may also be stored as computer-executable instructions in a computer-readable medium such as a computer-readable medium 620 of a computing de vice 610.

An example process for fabricating a TFET device may begin, with block 622, "PROVIDE A SUBSTRATE OF A FIRST SUBSTRATE MATERIAL", where the deposition module 404 of FIG. 4 may begin the fabrication process with a silicon based substrate depending on desired TFET type (e.g., p-type or n-type).

Block 622 may be followed by block 624, "DEFINE DRAIN REGION BY DOPING THE FIRST SUBSTRATE MATERIAL WITH DOPANTS OF A FIRST TYPE", where the deposition module 404 may create the drain region 112 by doping that region of the substrate with dopants for the drain (n+ Si, for example).

Block 624 may be followed by block 626, "REDUCE PART OF TOP SUBSTRATE TO CREATE A STEP IN THE CHANNEL REGION", where the etching, module 406 may reduce a top portion 202 of the substrate 114 over the yet-to-be formed source region 108 and the channel region 118 between the source and drain regions leaving some of the channel region at the same thickness as the drain region.

Block 626 may be followed by block 628, "FURTHER REDUCE PART OF THE SUBSTRATE TO ALLOW ROOM FOR SOURCE REGION", where the etching module 406 may reduce a top portion 202 of the substrate 114 over the yet-to-be formed, source region 108 and the channel region 118 between the source and drain regions leaving some of the channel region at the same thickness as the drain region.

Block 628 may be followed by block 630, "GROW SOURCE REGION (GE HEAVILY DOPED WITH DOPANTS OF SECOND TYPE)", where the source region may be grown and doped with dopants of the opposite type of those used in the drain region (p+ Ge, for example) by the deposition module 404.

Block 630 may be followed by block 632, "FORM GATE DIELECTRIC AND GATE METAL", where the deposition module 404 may form, the gate dielectric and the gate metal over portions (222, 224) the source and channel regions.

Block 632 may be followed by block 634, "REDUCE PART OF TOP OF SOURCE REGION", where a top portion 232 of the source region 108 may be reduced by the etching module 406 leaving another top portion of the source region at substantially the same thickness as the channel region 118.

Block 634 may be followed by block 636, "FORM SIDE-WALL SPACER(S)", where the deposition module 404 may form the side-wall spacer materials substantially surrounding the gate electrode 104 and interfacing with the source and drain electrodes 102 and 106, source region 108, channel region 118, and drain region 112.

Block 636 may be followed by block 638, "FORM SOURCE AND DRAIN ELECTRODES THROUGH SILICIDATION/METALLIZATION", where the source electrode 102 and drain electrode 106 may be formed over the source and drain regions respectively by the silicidation/metallization module 408.

The operations included in the processes of FIG. 6 described above are for illustration purposes. Fabricating a TFET with supersteep sub-threshold swing and high values of $I_{ON}$ may be implemented by similar processes with fewer or additional operations. In some examples, the operations may be performed in a different order. In some other examples, various operations may be eliminated. In still other examples, various operations may be divided into additional operations, or combined together into fewer operations. Although illustrated as sequentially ordered operations, in some implementations, the various operations may be performed hi a different order, or in some cases various operations may be performed at substantially the same time.

FIG. 7 illustrates a block diagram of an example computer program product, arranged in accordance with at least some embodiments described herein.

In some examples, as shown in FIG. 7, the computer program product 700 may include a signal bearing medium 702 that may also include one or more machine readable instructions 704 that, when executed by, for example, a processor, may provide the functionality described herein. Thus, for example, referring to the processor 504 in FIG. 5, the fabrication application 522 may undertake one or more of the tasks shown in FIG. 7 in response to the instructions 704 conveyed to the processor 504 by the signal bearing medium 702 to perform actions associated with fabricating a TFET device as described herein. Some of those instructions may include, for example, providing a substrate of a first substrate material; defining drain region by doping the first substrate material with dopants of a first type; reducing part of top substrate to create a step is the channel region; further reducing part of the substrate to allow room for source region; growing source region (Ge heavily doped with dopants of second type); forming gate dielectric and gate metal; reducing part of top of source region; forming side-wall spacer(s); and/or forming source, gate, drain electrodes through silicidation/metallization, according to some embodiments described herein.

In some implementations, the signal bearing medium 702 depicted in FIG. 7 may encompass a computer-readable medium 706, such as, but not limited to, a hard disk drive (HDD), a solid state drive (SSD), a Compact Disc (CD), a Digital Versatile Disk (DVD), a digital tape, memory, etc. In some implementations, the signal bearing medium 702 may encompass a recordable medium 708, such as, but not limited to, memory, read/write (R/W) CDs, R/W DVDs, etc. In some implementations, the signal bearing medium 702 may encompass a communications medium 710, such as, but not limited to, a digital and/or an analog communication medium (e.g., a filler optic cable, a waveguide, a wired communication link, a wireless communication link, etc.). Thus, for example, the computer program product 700 may be conveyed to one or more modules of the processor 704 by an RF signal bearing medium, where the signal bearing medium 702 is conveyed by the wireless communications medium 710 (e.g., a wireless communications medium conforming with the IEEE 802.11 standard).

According to some examples, tunnel field-effect transistor (TFET) devices may be described. An example TFET device may include one or more of a substrate; a p-i-n tunnel structure formed within the substrate, where the p-i-n tunnel structure includes a source region of a first type, a drain region of a second type, and a channel region of the substrate between the drain region and the source region; and a gate electrode separated from the p-i-n tunnel structure through a gate dielectric, where the gate dielectric is positioned partially over the source region and partially over the channel region.

According to other examples, the TFET device may include a side-wall spacer material arranged to substantially surround the gate electrode and the gate dielectric, and further arranged to interlace with a portion of the source region, a source electrode, a portion of the channel region, a portion of the drain region, and a drain electrode. A first portion of the side-wall spacer material may interface with the source region and a second portion of the side-wall spacer material may interface with a stepped top portion of the channel region and the portion of the drain region.

According to further examples, the drain electrode may be configured to interface the drain region and the second portion of the side-wall spacer material. The source electrode may be configured to interface the source region and the first portion of the side-wall spacer material. The first and the second portions of the side-wall spacer material may have a width in a range between about 5 nm and about 15 nm. The gate dielectric may be composed of a hafnium based oxide, a silicon based oxide, a silicon based nitride, or a high-k gate dielectric and the side-wall spacer material may be composed of a silicon based oxide, silicon nitride, or a low-k dielectric.

According to yet other examples, the source region may be composed of germanium (Ge), silicon-germanium (SiGe), indium-arsenide (InAs), or indium-gallium-arsenide (InGaAs) doped with dopants of a first type. The drain region may be composed of silicon or silicon-germanium heavily-doped with dopants of a second type. The substrate may be composed of silicon or silicon-germanium lightly-doped with dopants either the first or the second type. The dopants of the first type may include p dopants and dopants of the second type may include n dopants. Alternatively, the dopants of the first type may include n-type dopants and dopants of the second type may include p-type dopants.

According to yet further examples, the first portion of the source region may have a first thickness in a range between about 10 nm and about 40 nm, and the second portion of the source region may have a second thickness in a range between about 15 nm and about 60 nm. The gate electrode may have a width in a range between about 10 nm and about 100 nm. The gate dielectric may have a thickness in a range between about 0.4 nm and about 5 nm. The channel region may have a width in a range between about 6 nm and about 30 nm and overlap between the channel region and the gate dielectric may be in a range between about 3 nm and 10 nm.

According to other examples, methods for fabricating a tunnel field-effect transistor (TFET) device may be described. An example method may include providing a substrate of a first substrate material; doping a first region of the first substrate material with dopants of a first type effective to form a drain region; reducing a first top portion of the substrate effective to form a stepped channel region; and reducing a portion of the first top portion of the substrate effective to form a source region. The example method may further include growing a source region of a first material doped with dopants of a second type over the reduced portion of the substrate; forming a gate dielectric and a gate electrode over a portion of top surfaces of the source region and the channel region; reducing a portion of the top surface of the source region to allow room for a source electrode and a side-wall spacer material; and/or forming the side-wall spacer material over the reduced portion of the top surface of the source region and partially over the drain region and the channel region, where the side-wall spacer material substantially surrounds the gate dielectric and the gate electrode.

According to some examples, forming the side-wall spacer material partially over the channel region may include forming a bottom portion of the side-wall spacer material to interface a stepped top surface of the channel region. The method may also include forming a source electrode over the source region and adjacent to the side-wall spacer material, and forming a drain electrode over the drain region and adjacent to the side-wall spacer material. The method may further include forming the gate electrode, the source electrode, and the drain electrode through silicidation and metallization.

According to further examples, the method may further include forming the gate dielectric using a hafnium based oxide or a high-k dielectric, and forming the side-wall spacer material using a silicon based oxide or a low-k dielectric. Reducing the first top portion of the substrate and reducing the portion of the top surface of the source region may include employing selective etching. Selective etching may include anisotropic dry etching. Growing the source region may include employing germanium (Ge), silicon-germanium (SiGe), indium-arsenide (InAs), or indium-gallium-arsenide (InGaAs) doped with dopants of the second type. Forming the drain region may include employing silicon or silicon-germanium heavily-doped with dopants of the first type.

According to yet other examples, the substrate may include silicon or silicon-germanium lights-doped with dopants of either the first or the second type. The dopants of the first type may include p-type dopants and dopants of the second type may include n-type dopants. Alternatively, the dopants of the first type may include n-type dopants and dopants of the second type may include p-type dopants. Reducing the first top portion of the substrate may include removing a portion of the substrate in a range between about 5 nm and about 20 nm to create the stepped channel region and reducing the portion of the fat top portion of the substrate may include removing another portion of the substrate in a range between about 15 nm and about 60 nm. Reducing the portion of the top surface of the source region may include removing a portion of the source region in a range between about 5 nm and about 20 nm.

According to yet further examples, growing the source region and forming the drain region may include allowing a thickness for the channel region between the source region and the drain region in a range between about 5 nm and about 15 nm. Furthermore, any of the forming or reducing operations may be performed by at least one of the semiconductor fabrication techniques selected from the group of chemical vapor deposition (CVD), low pressure CVD (LPCVD), atmospheric pressure CVD (APCVD), ultrahigh vacuum CVD (UHVCVD), atomic layering deposition (ALD), molecular layer deposition (MLD), plasma-enhanced CVD (PECVD), metal-organic CVD (MOCVD), molecular beam epitaxy (MBE), sputter deposition, ion implantation, annealing, wet chemical etching, gaseous chemical etching, plasma etching, reactive ion etching (RIE), masking lithography, and/or chemical mechanical polishing (CMP).

According to further examples, systems for fabricating a tunnel field-effect transistor (TFET) device may be described. An example system may include a deposition module, an etching module, and a controller. The deposition module may be configured to receive a substrate of a first substrate material; dope the first substrate material in a first region with dopants of a first type effective to form a drain region; grow a source region of a first material doped with dopants of a second type over a reduced portion of the substrate; and form the gate dielectric over a portion of a top surface of the source region and a portion of a channel region. The deposition module may also form a gate electrode over the gate dielectric; and form a side-wall spacer material over a reduced portion of the top surface of the source region and partially over the drain region and the channel region, where the side-wall spacer material substantially surrounds the gate dielectric and the gate electrode. The etching module may be configured to reduce a first top portion of the substrate effective to form the channel region in a stepped shape; reduce a portion of the first top portion of the substrate effective to form the source region; and reduce the portion of the top surface of the source region effective to form a source electrode and the side-wall spacer material. The controller may be configured to coordinate operations of the deposition module and the etching module.

According to some examples, the system may further include a silicidation/metallization module configured to silicidize and metallize top surfaces of the source region and the drain region effective to form the source electrode and a drain electrode, respectively. The silicidation/metallization module may be further configured to silicidize and metallize a top surface of the gate dielectric effective to form the gate electrode. The deposition module may also be configured to form a portion of the side-wall spacer material with a stepped shape bottom to interlace with the channel region. The deposition module may further be configured to form the gate dielectric using a hafnium based oxide or a high-k gate dielectric and the side-wall spacer material using a silicon based oxide or a low-k dielectric.

According to yet other examples, a tunnel, field-effect transistor (FET) device may be described. The tunnel FET device may include a substrate and a source, where a source bottom surface is interfaced with a top surface of the substrate, and where a first portion of the source has a lower thickness than a second portion of the source. The tunnel FET device may further include a drain, where a bottom surface of the drain is interfaced with the top surface of the substrate, where the source and the drain are separated by a channel of the substrate, and where a first surface of the channel is interfaced with a first surface of the second portion of the source; and a gate dielectric, where a bottom surface of the gate dielectric is interfaced with a top surface of the second portion of the source region and part of the top surface of the channel region.

There is little distinction left between hardware and software implementations of aspects of systems; the use of hardware or software is generally (but not always, in that in certain contexts the choice between hardware and software may become significant) a design choice representing cost vs. efficiency tradeoffs. There are various vehicles by which processes and/or systems and/or other technologies described herein may be effected (e.g., hardware, software, and/or firmware), and that the preferred vehicle will vary with the contest in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples, contain one or more functions, and/or operations, it will be understood by those within the art that each function and/or operation within such block diagrams, flowcharts, or examples may be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, may be equivalently implemented in integrated circuits, as one or more computer programs executing on one or more computers (e.g., as one or more programs executing on one or more computer systems), as one or more programs executing on one or more processors (e.g., as one or more programs executing on one or more microprocessors), as firmware, or as virtually any combination thereof, and that designing the circuitry and/or writing the code for the software and/or firmware would be well within the skill of one of skill in the art in light of this disclosure.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is also to be understood that the terminology used herein is for the purpose of describing particular embodiments only, and is not intended to be limiting.

In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive (HDD), a Compact Disc (CD), a Digital Versatile Disk (DVD), a digital tape, a computer memory, a solid state drive (SSD), etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the device and/or processes described herein may be integrated into a data processing system via a reasonable amount of experimentation. Those having skill in the art will recognize that a data processing system may include one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity of gantry systems; control motors for moving and/or adjusting components and/or quantities).

A data processing system may be implemented utilizing any suitable commercially available components, such as those found in data computing/communication and/or network computing/communication systems. The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediate components. Likewise, any two components so associated may also be viewed as being "operably connected", or "operably coupled", to each other to achieve the desired functionality, and any two components capable of being so associated may also be viewed as being "operably couplable", to each other to achieve the desired functionality. Specific examples of operably coup table include but are not limited to physically connectable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited, to," etc,). It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an"

limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down, into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What claimed is:

1. A tunnel field-effect transistor (FET) device, comprising:
    a bulk silicon substrate;
    a p-i-n tunnel structure formed within the bulk silicon substrate, the p-i-n tunnel structure comprising a source region of a first type, a drain region of a second type, and a channel region of the bulk silicon substrate between the drain region and the source region, wherein the drain region comprises silicon or silicon-germanium doped with dopants of the second type, and wherein the bulk silicon substrate comprises silicon or silicon-germanium doped with dopants of either the first type the second type;
    a gate electrode separated from the p-i-n tunnel structure through a gate dielectric, wherein the gate dielectric is positioned partially over the source region and partially over the channel region;
    a source electrode;
    a drain electrode;
    a first side-wall spacer material arranged to interface with each of a first portion of the source region and a portion of the source electrode; and
    a second side-wall spacer material arranged to interface with each of a stepped top portion of the channel region, a portion of the drain region, and a portion of the drain electrode.

2. The tunnel FET device according to claim 1, wherein each of the first side-wall spacer material and the second side-wall spacer material is further arranged to substantially surround the gate electrode and the gate dielectric.

3. The tunnel FET device according to claim 1, wherein the drain electrode is configured to interface with each of the portion of the drain region and a portion of the second side-wall spacer material.

4. The tunnel FET device according to claim 1, wherein the source electrode is configured to interface with each of the first portion of the source region and a portion of the first side-wall spacer material.

5. The tunnel FET device according to claim 1, wherein each of the fir side-wall spacer material and the second side-wall spacer material has a width in a range between about 5 nm and about 15 nm.

6. The tunnel FET device according to claim 1, wherein the source region comprises germanium (Ge), silicon-germanium (SiGe), indium-arsenide (InAs), or indium-gallium-arsenide (InGaAs) doped with the dopants of the first type.

7. The tunnel FET device according to claim 1, wherein the dopants of the first type include n-type dopants and the dopants of the second type include p-type dopants.

8. The tunnel FET device according to claim 1, wherein
    a second portion of the source region has a first thickness in a range between about 10 nm and about 40 nm, and wherein a third portion of the source region has a second thickness in a range between about 15 nm and about 60 nm;
    the gate electrode has a width in a range between about 10 nm and about 100 nm;
    the gate dielectric has a thickness in a range between about 0.4 nm and about 5 nm; and
    the channel region has a width in a range between about 6 nm and about 30 nm and overlap between the channel region and the gate dielectric is in a range between about 3 nm and 10 nm.

9. A tunnel field-effect transistor (FET) device, comprising:
    a substrate;
    a p-i-n tunnel structure formed within the substrate, the p-i-n tunnel structure comprising a source region of a first type, a drain region of a second type, and a channel region of the substrate between the drain region and the source region;
    a gate electrode separated from the p-i-n tunnel structure through a gate dielectric, wherein the gate dielectric is positioned partially over the source region and partially over the channel region;
    a source electrode;
    a drain electrode;

a first side-wall spacer material arranged to interface with each of a portion of the source region and a portion of the source electrode; and a second side-wall spacer material arranged to interface with each of a stepped top portion of the channel region, a portion of the drain region, and a portion of the drain electrode, wherein each of the first side-wall spacer material and the second side-wall spacer material is further arranged to substantially surround the gate electrode and the gate dielectric.

10. The tunnel FET device according to claim 9, wherein the gate dielectric comprises a hafnium based oxide, a silicon based oxide, a silicon based nitride, or a high-k gate dielectric, and wherein each of the first side-wall spacer material and the second side-wall spacer material comprises a silicon based oxide, silicon nitride, or a low-k dielectric.

11. The tunnel FET device according to claim 10, wherein the gate dielectric comprises a hafnium dioxide having a thickness of about 0.6 nm.

12. The tunnel FET device according to claim 9, wherein the gate electrode has a width of about 30 nm.

13. The tunnel FET device according to claim 9, wherein each of the first side-wall spacer material and the second side-wall spacer material has a width of about 10 nm.

14. The tunnel FET device according to claim 9, wherein the channel region has a width of about 10 nm.

* * * * *

UNITED STATES PATENT AND TRADEMARK OFFICE
CERTIFICATE OF CORRECTION

PATENT NO.         : 9,748,368 B2
APPLICATION NO.    : 14/902480
DATED              : August 29, 2017
INVENTOR(S)        : Mallik It is certified that error appears in the above-identified patent and that said Letters Patent is hereby corrected as shown below:

In the Specification

In Column 1, Line 11, delete "35 U.S.C. 119(b)" and insert -- 35 U.S.C. § 119(b) --, therefor.

In Column 1, Line 32, delete "low," and insert -- $I_{OFF}$, --, therefor.

In Column 1, Line 33, delete "current. $I_{on}$," and insert -- current, $I_{on}$, --, therefor.

In Column 1, Line 49, delete "threshold, voltage," and insert -- threshold voltage, --, therefor.

In Column 1, Line 63, delete "tray" and insert -- may --, therefor.

In Column 2, Line 6, delete "double-gale" and insert -- double-gate --, therefor.

In Column 2, Line 17, delete "field-effect," and insert -- field effect --, therefor.

In Column 2, Line 21, delete "dram" and insert -- drain --, therefor.

In Column 2, Line 23, delete "dram region and me source region," and insert -- drain region and the source region; --, therefor.

In Column 2, Line 39, delete "agate" and insert -- a gate --, therefor.

In Column 2, Line 61, delete "side-wall, spacer" and insert -- side-wall spacer --, therefor.

In Column 3, Line 1, delete "port ion" and insert -- portion --, therefor.

In Column 3, Line 2, delete "region, and" and insert -- region; and --, therefor.

In Column 3, Lines 59-60, delete "example, computer" and insert -- example computer --, therefor.

Signed and Sealed this
Nineteenth Day of December, 2017

Joseph Matal
*Performing the Functions and Duties of the
Under Secretary of Commerce for Intellectual Property and
Director of the United States Patent and Trademark Office*

CERTIFICATE OF CORRECTION (continued)
U.S. Pat. No. 9,748,368 B2

In Column 4, Line 2, delete "contest" and insert -- context --, therefor.

In Column 4, Line 7, delete "herein, it" and insert -- herein. It --, therefor.

In Column 4, Line 13, delete "drawing" and insert -- drawn --, therefor.

In Column 4, Line 19, delete "balk" and insert -- bulk --, therefor.

In Column 4, Line 36, delete "dimension" and insert -- dimensions --, therefor.

In Column 4, Line 40, delete "gale" and insert -- gate --, therefor.

In Column 5, Line 20, delete "section" and insert -- region --, therefor.

In Column 5, Line 22, delete "regions that" and insert -- regions, that --, therefor.

In Column 5, Line 64, delete "arsons" and insert -- various --, therefor.

In Column 6, Line 2, delete "sizes and" and insert -- sizes, and --, therefor.

In Column 6, Line 38, delete "fey" and insert -- by --, therefor.

In Column 7, Line 4, delete "splitter" and insert -- sputter --, therefor.

In Column 7, Line 32, delete "TFET Structure" and insert -- TFET structure --, therefor.

In Column 9, Line 30, delete "parallel interlace" and insert -- parallel interface --, therefor.

In Column 9, Line 48, delete "bus" and insert -- has --, therefor.

In Column 9, Line 57, delete "apart" and insert -- a part --, therefor.

In Column 10, Line 8, delete "program, in" and insert -- program. In --, therefor.

In Column 10, Line 24, delete "computing de vice" and insert -- computing device --, therefor.

In Column 10, Line 39, delete "etching, module" and insert -- etching module --, therefor.

In Column 10, Line 48, delete "formed, source" and insert -- formed source --, therefor.

In Column 10, Line 60, delete "form, the" and insert -- form the --, therefor.

In Column 11, Line 24, delete "hi a" and insert -- in a --, therefor.

In Column 11, Line 44, delete "step is" and insert -- step in --, therefor.

CERTIFICATE OF CORRECTION (continued)
U.S. Pat. No. 9,748,368 B2

In Column 11, Line 63, delete "filler" and insert -- fiber --, therefor.

In Column 12, Line 18, delete "interlace" and insert -- interface --, therefor.

In Column 13, Line 40, delete "lights-doped" and insert -- lightly-doped --, therefor.

In Column 13, Line 41, delete "first or" and insert -- first type or --, therefor.

In Column 13, Line 49, delete "fat" and insert -- first --, therefor.

In Column 14, Line 39, delete "interlace" and insert -- interface --, therefor.

In Column 14, Line 44, delete "tunnel, field-effect" and insert -- tunnel field-effect --, therefor.

In Column 15, Line 1, delete "contest" and insert -- context --, therefor.

In Column 15, Line 13, delete "functions, and/or" and insert -- functions and/or --, therefor.

In Column 16, Line 4, delete "device" and insert -- devices --, therefor.

In Column 16, Line 40, delete "coup table" and insert -- couplable --, therefor.

In Column 16, Line 58, delete "etc,). It" and insert -- etc.). It --, therefor.

In Column 17, Lines 36-37, delete "down, into" and insert -- down into --, therefor.

In the Claims

In Column 18, Line 3, in Claim 1, delete "type the" and insert -- type or the --, therefor.

In Column 18, Line 30, in Claim 5, delete "fir" and insert -- first --, therefor.